US010955363B2

(12) United States Patent
Zhou et al.

(10) Patent No.: US 10,955,363 B2
(45) Date of Patent: Mar. 23, 2021

(54) SOLDERING QUALITY DETECTION PLATFORM

(71) Applicants: Tyco Electronics (Shanghai) Co. Ltd., Shanghai (CN); Tyco Electronics (Dongguan) Ltd., Dongguan (CN); TE Connectivity Corporation, Berwyn, PA (US)

(72) Inventors: Lei Zhou, Shanghai (CN); Dandan Zhang, Shanghai (CN); Roberto Francisco-Yi Lu, Shanghai (CN); Hongzhou Shen, Shanghai (CN); Jian Zeng, Shanghai (CN)

(73) Assignees: Tyco Electronics (Shanghai) Co. Ltd., Shanghai (CN); Tyco Electronics (Dongguan) Ltd., Dongguan (CN); TE Connectivity Corporation, Berwyn, PA (US)

( * ) Notice: Subject to any disclaimer, the term of this patent is extended or adjusted under 35 U.S.C. 154(b) by 0 days.

(21) Appl. No.: 16/282,998

(22) Filed: Feb. 22, 2019

(65) Prior Publication Data

US 2019/0187070 A1  Jun. 20, 2019

Related U.S. Application Data

(63) Continuation of application No. PCT/IB2017/055036, filed on Aug. 21, 2017.

(30) Foreign Application Priority Data

Aug. 23, 2016 (CN) .......................... 201610710653.8

(51) Int. Cl.
*G01N 21/956* (2006.01)
*H05K 3/34* (2006.01)
(Continued)

(52) U.S. Cl.
CPC ....... *G01N 21/95684* (2013.01); *G01B 11/24* (2013.01); *G06T 7/0004* (2013.01); (Continued)

(58) Field of Classification Search
CPC .......... G06T 2207/10; H05K 2203/163; H05K 2201/10356; G01N 2021/95646; G01N 21/84
See application file for complete search history.

(56) References Cited

U.S. PATENT DOCUMENTS 5,517,575 A * 5/1996 Ladewski .............. G01B 11/24
356/394
5,956,134 A  9/1999 Roy et al.
(Continued)

FOREIGN PATENT DOCUMENTS

DE  112011104727 B4  7/2016
KR  1020080112819 A  12/2008
(Continued)

OTHER PUBLICATIONS

PCT International Search Report and Written Opinion, International Application No. PCT/IB2017/055036, dated Nov. 29, 2017, 10 pages.
(Continued)

*Primary Examiner* — Tony Ko
(74) *Attorney, Agent, or Firm* — Barley Snyder

(57) ABSTRACT

A soldering quality detection platform comprises a 2D image acquisition device adapted to acquire a 2D image of a soldered region of a soldered product, a 3D image acquisition device adapted to acquire a 3D image of the soldered region of the soldered product, and a judgment device. The judgment device is adapted to determine whether a soldering quality is qualified based on the 2D image and the 3D image of the soldered region of the soldered product.

20 Claims, 3 Drawing Sheets

(51) Int. Cl.
*G01B 11/24* (2006.01)
*G06T 7/00* (2017.01)
(52) U.S. Cl.
CPC ..... *H05K 3/34* (2013.01); *G01N 2021/95646* (2013.01); *G06T 2207/10* (2013.01); *H05K 2201/10356* (2013.01); *H05K 2203/163* (2013.01)

(56) References Cited

U.S. PATENT DOCUMENTS

| | | | |
|---|---|---|---|
| 6,291,816 B1* | 9/2001 | Liu | G01B 11/002 250/234 |
| 9,595,456 B2* | 3/2017 | Humphrey | C23C 16/0227 |
| 2018/0106595 A1* | 4/2018 | Christoph | G01B 5/012 |

FOREIGN PATENT DOCUMENTS

| | | |
|---|---|---|
| WO | 0188473 A1 | 11/2001 |
| WO | 2017050924 A1 | 3/2017 |

OTHER PUBLICATIONS

English translation of Abstract of DE 112011104727, dated Jul. 14, 2016, 1 page.
Abstract of KR20080112819, dated Dec. 26, 2008, 1 page.
Abstract of WO 2017050924, dated Mar. 30, 2017, 2 pages.
Abstract of WO 0188473, dated Nov. 22, 2001, 2 pages.

* cited by examiner

SOLDERING QUALITY DETECTION PLATFORM

CROSS-REFERENCE TO RELATED APPLICATIONS

This application is a continuation of PCT International Application No. PCT/IB2017/055036, filed on Aug. 21, 2017, which claims priority under 35 U.S.C. § 119 to Chinese Patent Application No. 201610710653.8, filed on Aug. 23, 2016.

FIELD OF THE INVENTION

The present invention relates to a detection platform and, more particularly, to a detection platform for detecting a soldering quality.

BACKGROUND

A soldering quality of a soldered product is generally determined by human visual inspection. Such a manual judgment is subject to a high error rate and low efficiency. Therefore, in recent years, machine vision has been proposed to determine the soldering quality of the soldered product. A two-dimensional (2D) image of a soldered region, such as a soldered joint, of a soldered product is captured by a 2D camera, and a computer then determines whether the soldering quality is qualified based on the captured 2D image information.

The 2D image information of the soldered region, however, can only reflect information such as a shape and size of a 2D projection profile thereof, and cannot reflect a three-dimensional shape and size thereof. Determining whether the soldering quality is qualified only based on the 2D image information is still prone to erroneous judgment and reduced accuracy.

SUMMARY

A soldering quality detection platform comprises a 2D image acquisition device adapted to acquire a 2D image of a soldered region of a soldered product, a 3D image acquisition device adapted to acquire a 3D image of the soldered region of the soldered product, and a judgment device. The judgment device is adapted to determine whether a soldering quality is qualified based on the 2D image and the 3D image of the soldered region of the soldered product.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
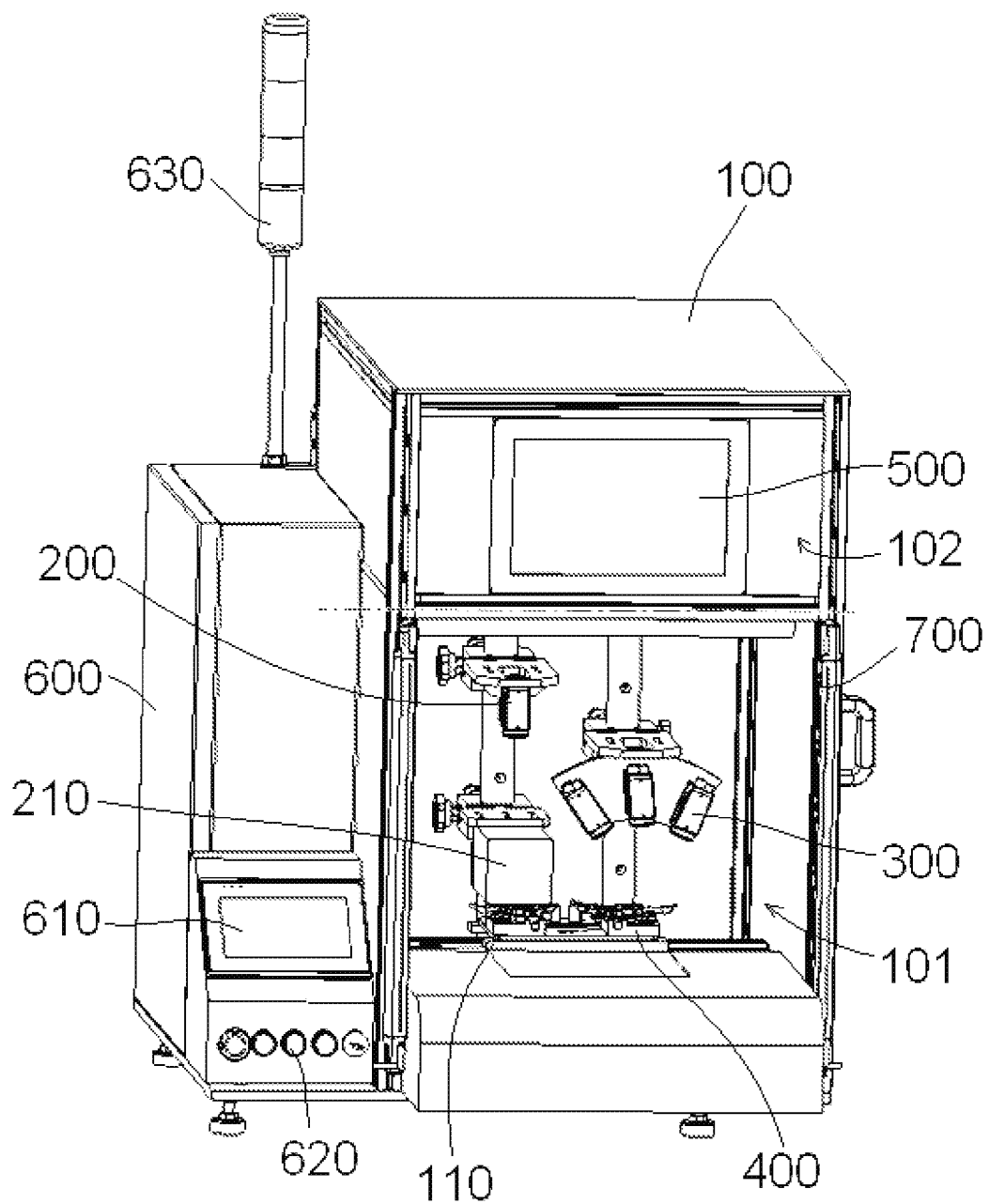
FIG. 1 is a perspective view of a soldering quality detection platform according to an embodiment.

The technical solution of the present disclosure will be described hereinafter in further detail with reference to the following embodiments, taken in conjunction with the accompanying drawings. In the specification, the same or similar reference numerals indicate the same or similar parts. The description of the embodiments of the present disclosure hereinafter with reference to the accompanying drawings is intended to explain the general inventive concept of the present disclosure and should not be construed as a limitation to the present disclosure.

In addition, in the following detailed description, for the sake of explanation, numerous specific details are set forth in order to provide a thorough understanding of the disclosed embodiments. It will be apparent, however, that one or more embodiments may also be practiced without these specific details. In other instances, well-known structures and devices are illustrated schematically in order to simplify the drawing.

A soldering quality detection platform according to an embodiment is shown in FIG. 1. The soldering quality detection platform comprises a two-dimensional (2D) image acquisition device 200, 210, a three-dimensional (3D) image acquisition device 300, and a judgment device. The 2D image acquisition device 200, 210 is adapted to acquire a 2D image of a soldered region of a soldered product 10, 20 to be detected, shown in FIG. 2. The 3D image acquisition device 300 is adapted to acquire a 3D image of the soldered region of the soldered product 10, 20.

The judgment device is adapted to determine whether a soldering quality is qualified based on the acquired 2D and 3D images of the soldered region of the soldered product 10, 20. In an embodiment, the judgment device is a computer including a processor and a non-transitory computer readable medium connected to the processor and storing computer instructions thereon that are executable by the processor. In the embodiment shown in FIG. 1, the soldering quality detection platform comprises a display device 500 adapted to display a judgment result obtained by the judgment device. The display device 500 may be connected to the computer of the judgment device.

In the embodiment shown in FIG. 1, the 2D image acquisition device 200, 210 is a 2D camera system adapted to capture a 2D image of the soldered region of the soldered product 10, 20. The 2D camera system includes a 2D camera 200 and an illumination light source 210.

The 3D image acquisition device 300, in the embodiment shown in FIG. 1, is a 3D camera system adapted to capture a 3D image of the soldered region of the soldered product 10, 20. The 3D camera system includes a stereoscopic camera and a laser camera.

The soldering quality detection platform, as shown in FIG. 1, comprises a support cabinet 100 including a first accommodation chamber 101 and a second accommodation chamber 102 vertically spaced apart from each other. The first accommodation chamber 101 is located below the second accommodation chamber 102. The 2D image acquisition device 200, 210 and the 3D image acquisition device 300 are installed in the first accommodation chamber 101. The display device 500 is mounted in the second accommodation chamber 102.

Figure 2:
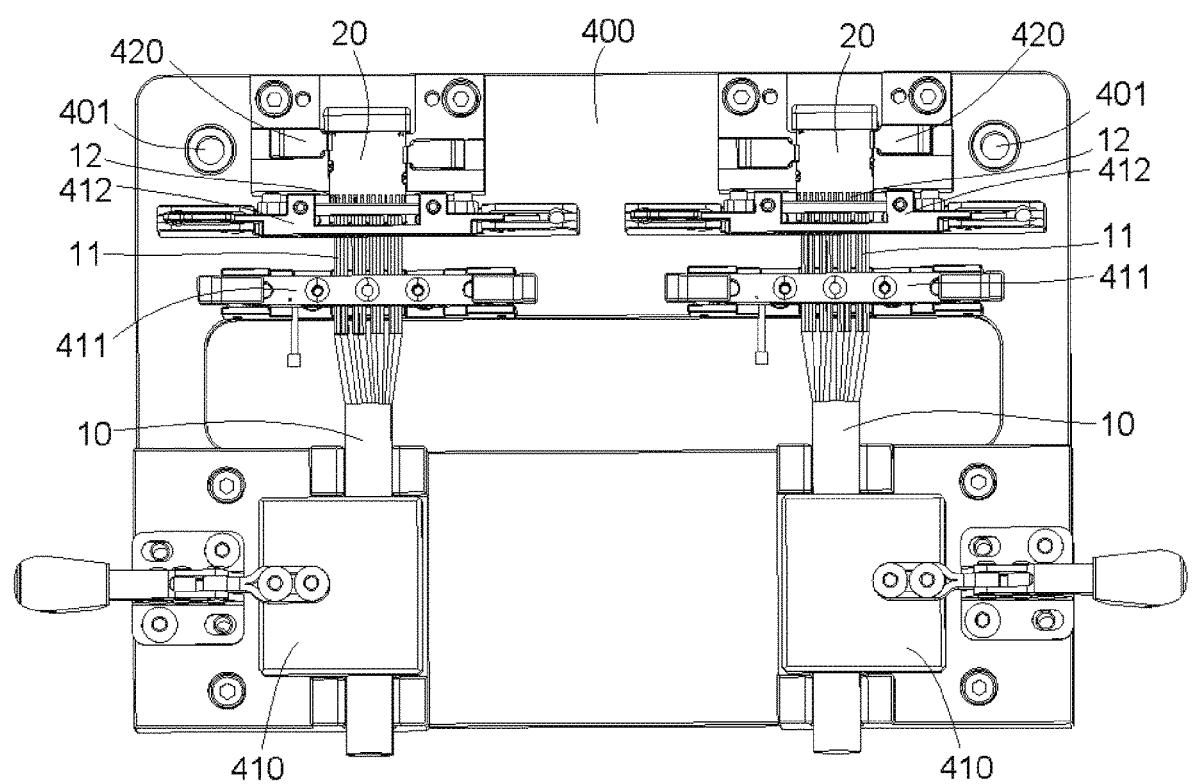
FIG. 2 is a top view of a carrier of the soldering quality detection platform.

The soldering quality detection platform comprises a carrier 400, as shown in FIGS. 1 and 2, adapted to be loaded with the soldered product 10, 20. The carrier 400, as shown in FIG. 2, has a plurality of clamps 410, 411, 412, 420 adapted to clamp and secure the soldered product 10, 20 to be detected. The soldering quality detection platform further comprises a tray 110 adapted to load the carrier 400. As shown in FIGS. 1 and 2, one of the carrier 400 and the tray 110 has a plurality of positioning holes 401, and the other has a plurality of positioning pins adapted to be fitted within the plurality of positioning holes 401, respectively, so as to position the carrier 400 on the tray 110.

The soldered product 10, 20, as shown in FIG. 2, includes a cable 10 and a circuit board 20. The cable 10 has a plurality of wires 11, conductors 12 of which are soldered onto the circuit board 20. The carrier 400 has a first clamp 410 for clamping the cable 10, a second clamp 411 for clamping the plurality of wires 11, a third clamp 412 for clamping the conductors 12 of the plurality of wires 11, and a fourth clamp 420 for clamping the circuit board 20.

As shown in FIG. 1, the tray 110 is slidably mounted in the first accommodation chamber 101 of the support cabinet 100 to move between a loading station, a 2D detection station, a 3D detection station, and an unloading station. When the tray 110 is moved to the loading station, the tray 110 is in an unobstructed state so as to mount the carrier 400 loaded with the soldered product 10, 20 onto the tray 110. When the tray 110 is moved to the 2D detection station, the soldered product 10, 20 on the tray 110 is located immediately below the 2D image acquisition device 200, 210. When the tray 110 is moved to the 3D detection station, the soldered product 10, 20 on the tray 110 is located immediately below the 3D image acquisition device 300. When the tray 110 is moved to the unloading station, the tray 110 is in the unobstructed state so as to remove the carrier 400 loaded with the soldered product 10, 20 from the tray 110. In an embodiment, the soldering quality detection platform comprises a drive mechanism adapted to drive the tray 110 to move between the loading station, the 2D detection station, the 3D detection station, and the unloading station.

The carrier 400, as shown in FIG. 2, is adapted to be simultaneously loaded with a plurality of soldered products 10, 20, such that the soldering quality detection of the plurality of soldered products 10, 20 can be completed during a single detection process. In the embodiment shown in FIG. 2, the carrier 400 is simultaneously loaded with two soldered products 10, 20 to be detected.

The soldering quality detection platform, as shown in FIG. 1, comprises a human-machine interaction interface 610 adapted to set operating parameters of the 2D image acquisition device 200, 210 and the 3D image acquisition device 300, a detection start button 620 adapted to activate the 2D image acquisition device 200, 210 and the 3D image acquisition device 300 to perform the soldering quality detection, and a state display lamp 630 adapted to display current operating state of the soldering quality detection platform. The soldering quality detection platform may also comprise an electronic control cabinet 600. In an embodiment, the human-machine interaction interface 610, the detection start button 620, and the state display lamp 630 are mounted on the electronic control cabinet 600.

The soldering quality detection platform, as shown in FIG. 1, comprises a safety light curtain protection device 700. The safety light curtain protection device 700 comprises a light emitter emitting a light to cover an opening of the first accommodation chamber 101 of the support cabinet 100 in a manner of a light curtain, and a light receiver receiving the light emitted from the light emitter. Thus, when the safety light curtain protection device 700 detects that an object is entering the light curtain, the soldering quality detection platform will immediately stop the detection to protect the safety of an operator. The light emitter and the light receiver of the safety curtain detector 700 are mounted on side frames at both sides of the opening of the first accommodation chamber 101 of the support cabinet 100.

Figure 3:
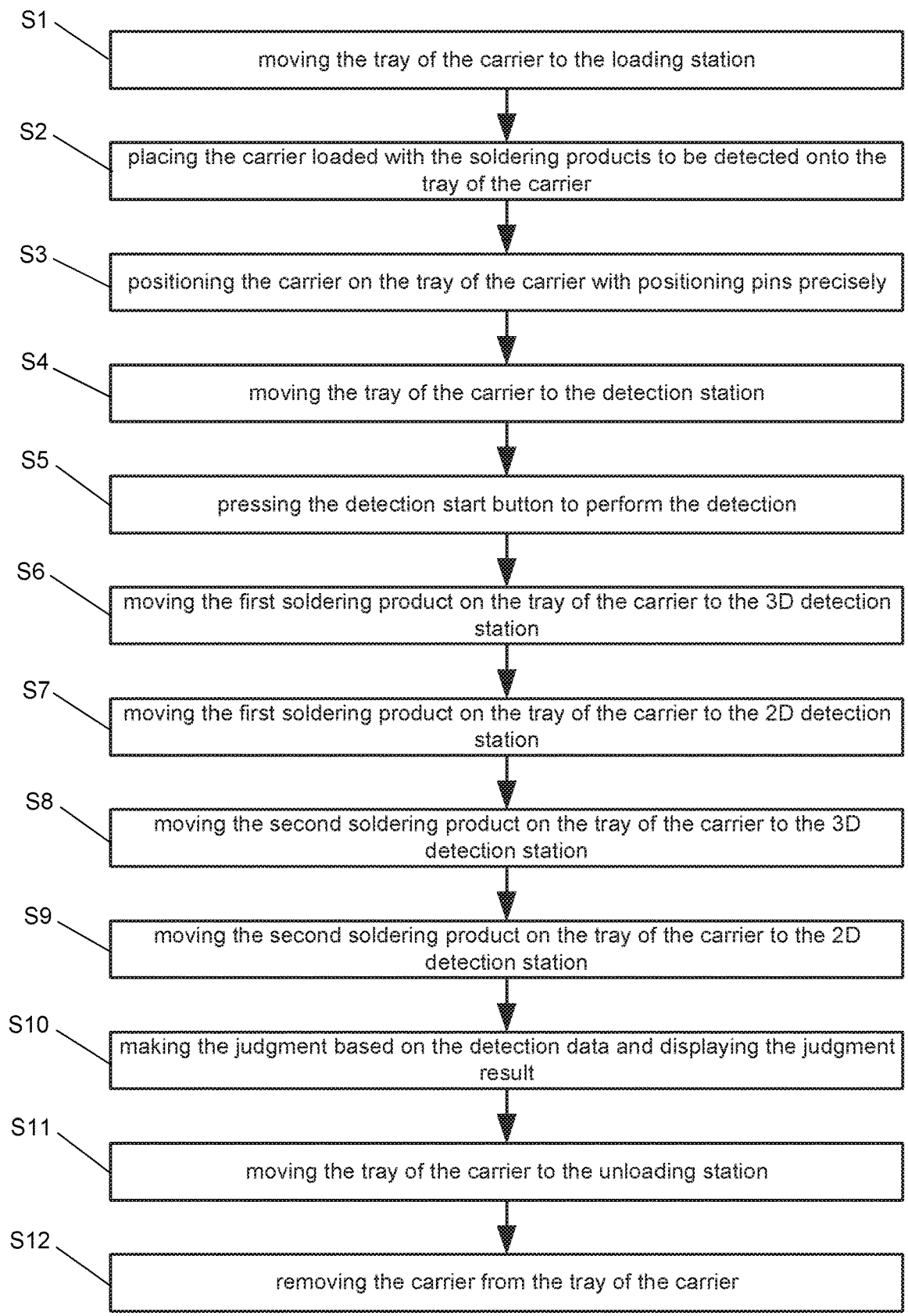
FIG. 3 is a flow chart of a process of operating the soldering quality detection platform.

A process of operating the soldering quality detection platform is shown in FIG. 3 and will be described with reference to FIGS. 1-3. Initially, as shown in FIG. 2, two soldered products 10, 20 to be detected, hereinafter referred as a first soldered product 10 and a second soldered product 20, are loaded onto the carrier 400.

In a step S1, the tray 110 is moved to the loading station.

In a step S2, the carrier 400 loaded with the two soldered products 10, 20 to be detected is placed onto the tray 110.

In a step S3, the carrier 400 is positioned on the tray 110 with the positioning pins.

In a step S4, the tray 110 is moved to the detection station.

In a step S5, the detection start button 620 is pressed to perform the detection.

In a step S6, the first soldered product 10 is moved on the tray 110 to the 3D detection station.

In a step S7, the first soldered product 10 is moved on the tray 110 to the 2D detection station.

In a step S8, the second soldered product 20 is moved on the tray 110 to the 3D detection station.

In a step S9, the second soldered product 20 is moved on the tray 110 to the 2D detection station.

In a step S10, whether the soldering quality is qualified is determined based on the acquired 2D and 3D images of the soldered regions of the soldered products 10, 20, and the judgment result is displayed.

In a step S11, the tray 110 is moved to the unloading station.

In a step S12, the carrier 400 is removed from the tray 110.

Lastly, the soldered products 10, 20 are removed from the carrier 400.

What is claimed is:

1. A soldering quality detection platform, comprising:
   a 2D image acquisition device adapted to acquire a 2D image of a soldered region of a soldered product, the soldered product including a cable having a plurality of conductors soldered onto a circuit board;
   a 3D image acquisition device adapted to acquire a 3D image of the soldered region of the soldered product;
   a judgment device adapted to determine whether a soldering quality is qualified based on the 2D image and the 3D image of the soldered region of the soldered product;
   a carrier adapted to be loaded with the soldered product and having a plurality of clamps adapted to clamp and secure the soldered product; and
   a tray adapted to be loaded with the carrier,
   wherein the carrier includes a first positioning feature and the tray includes a second positioning feature complementary to the first positioning feature for positioning the carrier on the tray.

2. The soldering quality detection platform of claim 1, further comprising a display device adapted to display a judgment result obtained by the judgment device.

3. The soldering quality detection platform of claim 2, wherein the 2D image acquisition device is a 2D camera system including a 2D camera and an illumination light source.

4. The soldering quality detection platform of claim 3, wherein the 3D image acquisition device is a 3D camera system including a stereoscopic camera and a laser camera.

5. The soldering quality detection platform of claim 4, further comprising a support cabinet having a first accommodation chamber and a second accommodation chamber vertically spaced apart from each other.

6. The soldering quality detection platform of claim 5, wherein the 2D image acquisition device and the 3D image acquisition device are installed in the first accommodation chamber and the display device is mounted in the second accommodation chamber.

7. The soldering quality detection platform of claim 1, wherein one of the carrier and the tray has a plurality of positioning holes and the other has a plurality of positioning pins, the plurality of positioning pins are adapted to be fitted within the plurality of positioning holes to position the carrier on the tray.

8. A soldering quality detection platform, comprising:
   a support cabinet having a first accommodation chamber;
   a 2D image acquisition device adapted to acquire a 2D image of a soldered region of a soldered product;
   a 3D image acquisition device adapted to acquire a 3D image of the soldered region of the soldered product;
   a judgment device adapted to determine whether a soldering quality is qualified based on the 2D image and the 3D image of the soldered region of the soldered product; and
   a tray adapted to convey the soldered product, wherein the tray is slidably mounted in the first accommodation chamber to move between a loading station, a 2D detection station, a 3D detection station, and an unloading station.

9. The soldering quality detection platform of claim 8, wherein the tray is in an unobstructed state at the loading station so as to mount the carrier loaded with the soldered product onto the tray, the soldered product on the tray is located immediately below the 2D image acquisition device at the 2D detection station, the soldered product on the tray is located immediately below the 3D image acquisition device at the 3D detection station, and the tray is in the unobstructed state at the unloading station so as to remove the carrier loaded with the soldered product from the tray.

10. The soldering quality detection platform of claim 9, wherein the carrier is adapted to simultaneously be loaded with a plurality of soldered products so that a soldering quality detection of the plurality of soldered products is completed during a single detection process.

11. The soldering quality detection platform of claim 8, further comprising a drive mechanism adapted to drive the tray to move between the loading station, the 2D detection station, the 3D detection station, and the unloading station.

12. The soldering quality detection platform of claim 9, further comprising:
   a human-machine interaction interface adapted to set operating parameters of the 2D image acquisition device and the 3D image acquisition device;
   a detection start button adapted to activate the 2D image acquisition device and the 3D image acquisition device to detect the soldering quality; and
   a state display lamp adapted to display a current operating state of the soldering quality detection platform.

13. The soldering quality detection platform of claim 12, further comprising an electronic control cabinet onto which the human-machine interaction interface, the detection start button, and the state display lamp are mounted.

14. The soldering quality detection platform of claim 8, further comprising a carrier adapted to be loaded with the soldered product, and the tray adapted to be loaded with the earner.

15. A soldering quality detection platform comprising:
   a support cabinet having a first accommodation chamber;
   a 2D image acquisition device installed in the first accommodation chamber and adapted to acquire a 2D image of a soldered region of a soldered product;
   a 3D image acquisition device installed in the first accommodation chamber and adapted to acquire a 3D image of the soldered region of the soldered product;
   a judgment device adapted to determine whether a soldering quality is qualified based on the 2D image and the 3D image of the soldered region of the soldered product; and
   a safety light curtain protection device including a light emitter emitting a light to cover an opening of the first accommodation chamber in a manner of a light curtain and a light receiver receiving the light emitted from the light emitter, the soldering quality detection platform immediately stops when the safety light curtain protection device detects that an object is entering the light curtain.

16. The soldering quality detection platform of claim 15, wherein the light emitter and the light receiver are mounted on a side frame at a pair of opposite sides of the opening of the first accommodation chamber.

17. The soldering quality detection platform of claim 15, further comprising a display device adapted to display a judgment result obtained by the judgment device, the display installed in a second accommodation chamber of the support cabinet.

18. A soldering quality detection platform, comprising:
   a 2D image acquisition device adapted to acquire a 2D image of a soldered region of a soldered product;
   a 3D image acquisition device adapted to acquire a 3D image of the soldered region of the soldered product;
   a judgment device adapted to determine whether a soldering quality is qualified based on the 2D image and the 3D image of the soldered region of the soldered product;
   a support cabinet having a first accommodation chamber and a second accommodation chamber vertically spaced apart from each other, wherein the 2D image acquisition device and the 3D image acquisition device are installed in the first accommodation chamber, and a display device adapted to display a judgment result obtained by the judgment device is mounted in the second accommodation chamber;
   a carrier adapted to be loaded with the soldered product; and
   a tray adapted to be loaded with the carrier.

19. The soldering quality detection platform of claim 18, wherein the soldered product has a cable and a circuit board, the cable includes a plurality of wires having a plurality of conductors soldered onto the circuit board.

20. The soldering quality detection platform of claim 19, wherein the carrier has a first clamp clamping the cable, a second clamp clamping the plurality of wires, a third clamp clamping the plurality of conductors, and a fourth clamp clamping the circuit board.

* * * * *